(12) United States Patent
Eun et al.

(10) Patent No.: US 11,624,771 B2
(45) Date of Patent: Apr. 11, 2023

(54) APPARATUS FOR INSPECTING ILLUMINATION OF LIGHTING MICRO LED

(71) Applicant: Microinspection, Inc., Seoul (KR)

(72) Inventors: Tak Eun, Seoul (KR); Ho Hack Kim, Seoul (KR); Beom Jin Kim, Gyeonggi-do (KR); Dong Jun Lee, Seoul (KR)

(73) Assignee: Microinspection, Inc., Seoul (KR)

( * ) Notice: Subject to any disclaimer, the term of this patent is extended or adjusted under 35 U.S.C. 154(b) by 0 days.

(21) Appl. No.: 17/690,114

(22) Filed: Mar. 9, 2022

(65) Prior Publication Data

US 2022/0390503 A1 Dec. 8, 2022

(30) Foreign Application Priority Data

Jun. 2, 2021 (KR) .......... 10-2021-0071184
Dec. 13, 2021 (KR) .......... 10-2021-0177181

(51) Int. Cl.
*G01R 31/26* (2020.01)
*G01R 1/067* (2006.01)
*H01L 25/075* (2006.01)

(52) U.S. Cl.
CPC ..... *G01R 31/2635* (2013.01); *G01R 1/06783* (2013.01); *H01L 25/0753* (2013.01)

(58) Field of Classification Search
CPC .......... H01L 33/60; H01L 2924/12042; H01L 33/62; H01L 2924/12044; H01L 25/0753; G02B 6/0028; G02B 6/0068; G02B 6/0095; G02B 6/0043; G02B 19/0047; G02B 19/0066; G02B 27/0172; G02B 6/003; G02B 3/12; G02B 6/0073; G02B 6/0093; G02B 6/10; G02B 6/0055; G02B 6/0041; G02B 23/2461; G02B 26/0825;
(Continued)

(56) References Cited

U.S. PATENT DOCUMENTS 8,415,174 B2 * 4/2013 Tanaka ............. H10K 50/19
 257/E21.527
10,713,985 B2 * 7/2020 Ju .................... G09G 3/006
(Continued)

FOREIGN PATENT DOCUMENTS

KR 2019-0106655 A 9/2019

*Primary Examiner* — Vinh P Nguyen
(74) *Attorney, Agent, or Firm* — Harness, Dickey & Pierce, P.L.C.

(57) ABSTRACT

The present disclosure provides an apparatus for illumination inspection of micro LEDs. An apparatus for illumination inspection of micro LEDs includes a surface-contact probe making a surface contact, through an electrical resistive material, with a front surface of an LED assembly of multiple micro LEDs arranged forwardly and interconnecting LED electrodes at both ends of the micro LEDs, probe electrodes to be in line contact with one side and the other side of the surface-contact probe for supplying electric power, an imaging unit for photographing the LED assembly from an opposite surface of the surface-contact probe, to where the surface-contact probe is contacted, and a control unit for supplying electric power to the probe electrodes forwardly along the micro LEDs as aligned and for inspecting the micro LEDs illumination based on images of the LED assembly photographed by the imaging unit before and after supplying the electric power.

9 Claims, 5 Drawing Sheets

(58) Field of Classification Search
CPC ........ G02B 6/022; G02B 7/38; G02B 6/3566;
G02B 6/4226; G02B 7/10; G01N
2201/062; G01N 21/6428; G01N 21/359;
G01N 2201/08; G01N 15/1436; G02F
1/133616; G01R 1/06783; G01R 31/2635
See application file for complete search history.

(56) References Cited

U.S. PATENT DOCUMENTS 11,002,783 B2 * 5/2021 Lin .................. G01R 29/14
11,037,841 B2 * 6/2021 Henley ............. G01R 31/3025

* cited by examiner

APPARATUS FOR INSPECTING ILLUMINATION OF LIGHTING MICRO LED

CROSS-REFERENCE TO RELATED APPLICATIONS

This application is based on, and claims priority from, Korean Patent Application Number 10-2021-0071184, filed Jun. 2, 2021, and Korean Patent Application Number 10-2021-0177181, filed Dec. 13, 2021, the disclosures of which are incorporated by reference herein in their entireties.

TECHNICAL FIELD

The present disclosure in some embodiments relates to an apparatus for illumination inspection of micro light emitting diodes (LEDs). More particularly, the present disclosure relates to an apparatus for illumination inspection of micro LEDs, which utilizes a surface-contact probe for making surface contact with a front surface of an LED assembly of a plurality of micro LEDs arranged in a forward direction, supplies electric power to the micro LEDs at both ends of the surface-contact probe for turning on the micro LEDs, and thereby inspects the state of illumination of the micro LEDs in a lump.

BACKGROUND

The statements in this section merely provide background information related to the present disclosure and do not necessarily constitute prior art.

A light emitting diode (LED) is generally known to be a light emitting semiconductor device that converts an electric current into light by using a compound semiconductor material. The LED can implement a light source of various wavelength bands ranging from ultraviolet light to infrared light depending on the type of compound semiconductor material. It outperforms the conventional light sources, featuring a faster reaction speed, an ultra-small structure, and a long lifespan, and therefore has been employed in various fields such as lighting, electronic signage, TV, mobile phone and automobile.

In the relevant industries, to secure more market competitiveness, research is being actively conducted on the diversification of LED applications that can cover communications, medical, biomedical, or textile technologies in addition to display technology.

This requires technology improvement in flexible characteristics and sizing control of the LEDs, and a recent focus of attention is on the micro LEDs capable of improving flexibility and size control for use as a next-generation display.

A micro LED is a light emitting device manufactured with an arrangement of light emitting structures on the order of about 5 μm to 100 μm. As the light emitting structure itself can be used as a pixel, it is advantageous to achieve flexibility implementations and overcoming the breakage issues of conventional LEDs that are prone to breakage due to external shock.

These micro LEDs can be widely used in optical applications requiring low-power, small-size, and light-weight advancements, such as flexible displays, human body-implantable medical devices, and smart textiles combined with LEDs.

The background technology of the present disclosure is presented by Korean Patent Application Publication No. 10-2019-0106655 (published Sep. 18, 2019, and titled LED Probe Device and Transport Device).

SUMMARY

According to at least one embodiment, the present disclosure provides an apparatus for inspecting illumination of micro light emitting diodes (LEDs), including a surface-contact probe, probe electrodes, an imaging unit, and a control unit. The surface-contact probe is configured to make a surface contact, through an electrical resistive material, with a front surface of an LED assembly of a plurality of micro LEDs arranged in a forward direction and to interconnect LED electrodes at both ends of the micro LEDs. The probe electrodes are configured to be in line contact with one side and the other side of the surface-contact probe and to supply electric power. The imaging unit is configured to photograph the LED assembly from an opposite surface of the surface-contact probe, which is opposite to where the surface-contact probe is contacted. The control unit is configured to supply the electric power to the probe electrodes in a forward direction along the plurality of micro LEDs as aligned and to use images of the LED assembly photographed by the imaging unit before and after supplying the electric power as a basis for inspecting the illumination of the micro LEDs.

The surface-contact probe may include any one of electrical resistive film, electrical resistive PDMS (polydimethylsiloxane), electrical resistive liquid, and electrical resistive gel.

The surface-contact probe may further include a pressing means configured to press the surface-contact probe when implemented as the electrical resistive film, The pressing means may include a cushion member that presses the electrical resistive film with elastic force.

The pressing means may include pressing chamber for pressing the probe electrodes such that the electrical resistive film is disposed in the empty space by forming an empty space therein and injecting a pressing fluid into the inner empty space through an inlet.

The pressing fluid may include a non-conductive gas or liquid.

The surface-contact probe may further include a guide wall configured to limit a domain of the electrical resistive liquid or the electrical resistive gel in conformance with the LED assembly when implemented as the electrical resistive liquid or the electrical resistive gel, The apparatus according to the present disclosure may further include a transparent substrate configured to fix the LED assembly.

The apparatus according to the present disclosure may further include an output unit configured to output results of inspecting the illumination of the micro LEDs.

REFERENCE NUMERALS

| | |
|---|---|
| 10: probe electrode | 20: surface-contact probe |
| 22: electrical resistive film | 26: guide wall |
| 30: imaging unit | 40: control unit |
| 50: output unit | 60: power supply unit |
| 70: LED assembly | 75: micro LED |
| 82: cushion member | 84: inlet |
| 86: pressing fluid | 88: pressing chamber |

DETAILED DESCRIPTION

The present disclosure in at least one embodiment seeks to provide an apparatus for inspecting illumination of micro LEDs that addresses and resolves prior art deficiencies as follows. Employing micro LEDs into a display requires screening and inspection processes to be performed on a completed micro LED to check whether they are good products before transferring the micro LED products from a wafer to a target substrate. However, the micro LEDs are too small to be properly transferred and inspected, and the conventional methods suffer from broken or faulty micro LEDs or an increased cost due to manual processing.

Additionally, if multiple micro LEDs are transferred to a target substrate right on the wafer without a proper inspection, a possible fault on them may entail the risk of making the target substrate faulty as a whole.

The present disclosure has been devised to overcome the above deficiencies by providing an apparatus for illumination inspection of micro LEDs. The apparatus utilizes a surface-contact probe for making surface contact with a front surface of an LED assembly of a plurality of micro LEDs arranged in a forward direction, supplies electric power to the micro LEDs at both ends of the surface-contact probe for turning on the micro LEDs, and thereby inspects the state of illumination of the micro LEDs in a lump.

The following describes an apparatus for illumination inspection of micro LEDs according to the present disclosure by referring to the accompanying drawings. In the description, the thickness of the lines or the size of the components shown in the drawings may be exaggerated for clarity and convenience of explanation. Additionally, the terms to be described below are defined in consideration of functions in the present disclosure, which may vary according to the intentions or customs of users and operators. Therefore, definitions of these terms should be made based on the content throughout this specification.

Figure 1:
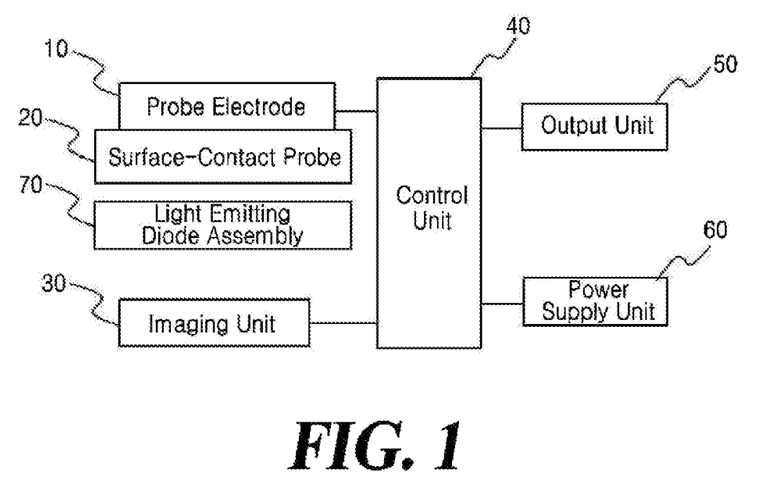
FIG. 1 is a block diagram of an apparatus for illumination inspection of micro LEDs according to at least one embodiment of the present disclosure.
Figure 2:
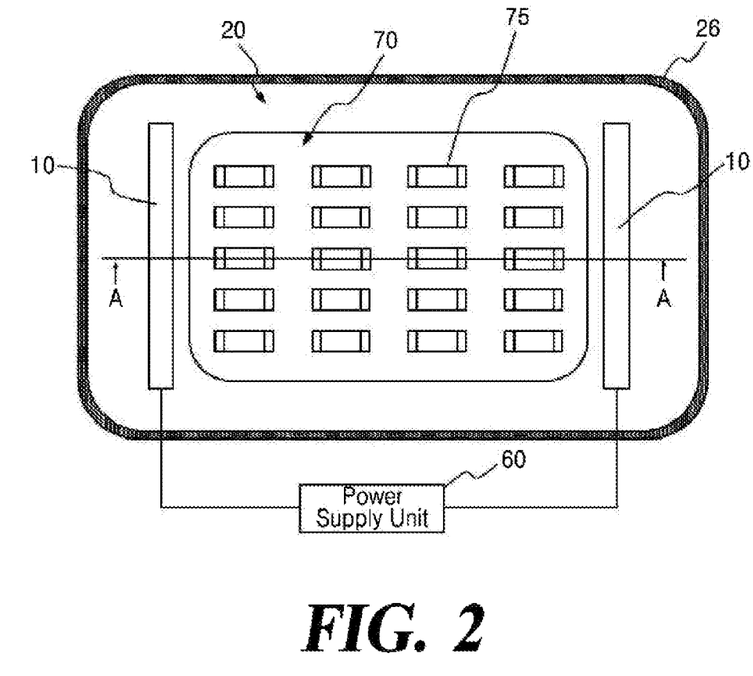
FIG. 2 is an exemplary view of an apparatus for illumination inspection of micro LEDs according to at least one embodiment of the present disclosure.
Figure 3:
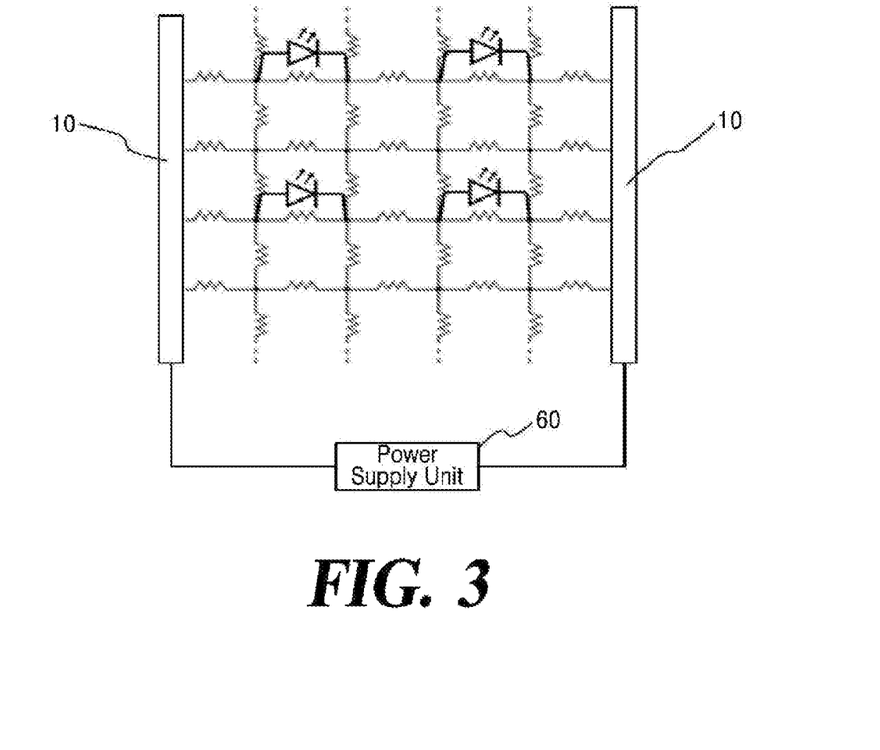
FIG. 3 is an equivalent circuit diagram of an apparatus for illumination inspection of micro LEDs according to at least one embodiment of the present disclosure.
Figure 4:
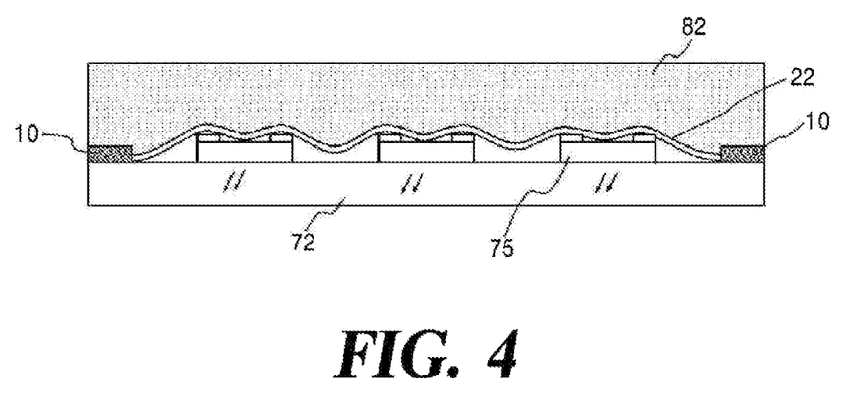
FIG. 4 is a cross-sectional view of a surface-contact probe of the apparatus for illumination inspection of micro LEDs shown in and taken along line A-A of FIG. 2, according to at least one embodiment of the present disclosure.
Figure 5:
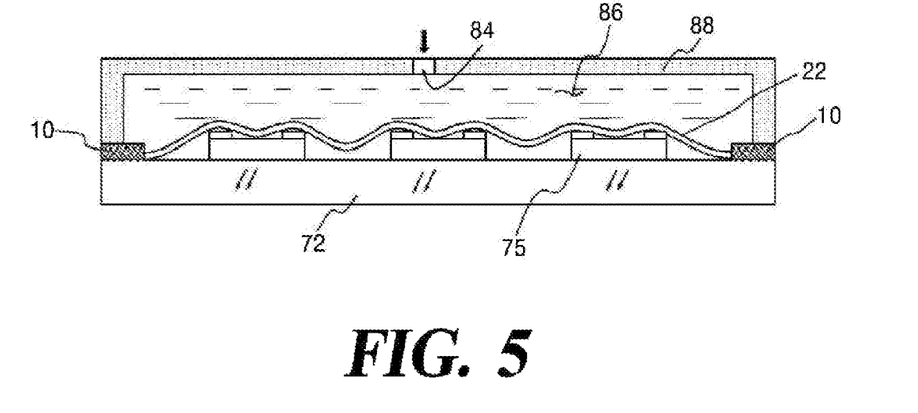
FIG. 5 is a cross-sectional view of a pressing means of apparatus for illumination inspection of micro LEDs shown in FIG. 2, according to at least one embodiment of the present disclosure.

FIG. 1 is a block diagram of an apparatus for illumination inspection of micro LEDs according to at least one embodiment of the present disclosure. FIG. 2 is an exemplary view of an apparatus for illumination inspection of micro LEDs according to at least one embodiment. FIG. 3 is an equivalent circuit diagram of an apparatus for illumination inspection of micro LEDs according to at least one embodiment. FIG. 4 is a cross-sectional view of a surface-contact probe of the apparatus for illumination inspection of micro LEDs shown in FIG. 2, according to at least one embodiment. FIG. 5 is a cross-sectional view of a pressing means of apparatus for illumination inspection of micro LEDs shown in FIG. 2, according to at least one embodiment.

As shown in FIG. 1, the apparatus for illumination inspection of micro LEDs according to at least one embodiment includes a surface-contact probe 20, probe electrodes 10, an imaging unit 30, a control unit 40, an output unit 50, and a power supply unit 60.

As shown in FIG. 2, an LED assembly 70 for inspection is composed of a plurality of micro LEDs 75 arranged in a forward direction. The surface-contact probe 20 is adapted to make a surface contact, through an electrical resistive material, with a front surface of the LED assembly 70 and to interconnect the LED electrodes at both ends of the micro LEDs 75.

Here, the surface-contact probe 20 is in surface contact with the front surface of the LED assembly 70 and provides the electrical resistive material with a length, area, and volume which collectively determine the resistance thereof to establish current paths through a plurality of micro LEDs 75 and thereby turns on the micro LEDs 75.

In particular, as shown in FIG. 3, by using the electrical resistive material having the determined resistivity, length, area, and volume, the LED assembly 70 has its micro LEDs 75 arranged into a resistor grid with each micro LED 75 located at each intersection. The resistor grid establishes serial and parallel connections of the micro LEDs 75 and thereby turns on the micro LEDs 75.

Here, the surface-contact probe 20 may be made of any one of electrical resistive film, electrical resistive PDMS (Polydimethylsiloxane), electrical resistive liquid, and electrical resistive gel.

Here, the electrical resistive film may include a thin film or a flexible soft film, both having resistivity.

Therefore, as shown in FIG. 2, the surface-contact probe 20 having resistivity is positioned to be in surface contact with the front surface of the LED assembly 70 composed of an arrangement of the multiple micro LEDs 75 and electrically powers the multiple micro LEDs 75 through the opposite probe electrodes 10, whereby lighting up the micro LEDs 75.

More specifically, the front surface of the LED assembly 70 making a surface contact through the surface-contact probe 20 of the electrical resistive material may be represented by the equivalent circuit as shown in FIG. 2.

In other words, the surface-contact probe 20 may be represented by a resistor grid, and each micro LED 75 of the LED assembly 70 may be represented to be disposed at each intersection. Therefore, when power is supplied to the probe electrodes 10 formed on both sides for turning on the power supply unit 60 in the forward direction, the micro LEDs 75 constituting the LED assembly 70 can be lit at the same time.

Here, the surface-contact probe 20 may be composed of an electrical resistive film 22 and may further include a pressing means for pressing the electrical resistive film 22.

As shown in FIG. 4 that is a cross-sectional view taken along line A-A of FIG. 2, the micro LEDs 75 are first arranged in the forward direction on a transparent substrate 72 for holding the LED assembly 70, and then the illumination inspection apparatus uses the surface-contact probe 20 to cover the LED assembly 70 by the electrical resistive film 22 to make surface contact with the micro LEDs 75.

Here, the transparent substrate 72 may include a wafer substrate for the manufacture of the micro LEDs 75.

The cushion member 82, which is a pressing means, may press the electrical resistive film 22, which is the surface-contact probe 20, to enable the surface-contact probe 20 to be in close contact with the micro LEDs 75.

As shown in FIG. 4, The cushion member 24 may press the electrical resistive film 22, which is the surface-contact probe 20, by elastic force to enable the surface-contact probe 20 to be in close contact with the micro LEDs 75, thereby allowing the electrical resistive film 22 to make the surface contact with all of the micro LEDs 75 of the LED assembly 70.

Also, as shown in FIG. 5, the pressing means may include a pressing chamber 88 forming an empty space therein to press and seal the probe electrode 10 so that the non-resistant film 22, which is a surface-contact probe 20, is disposed in the empty space, and injecting a pressing fluid 86 into the inner empty space through an inlet 84.

Here, the pressing fluid 86 may include a non-conductive gas or liquid.

In the process of manufacturing a panel by transferring the micro LEDs 75 on an electrical resistive PDMS, the electrical resistive PDMS may be used as the surface-contact probe 20 with the micro LEDs 75 transferred to the electrical resistive PDMS.

In the meantime, where the surface-contact probe 20 is an electrical resistive liquid or an electrical resistive gel, it is advantageous to further include a guide wall 26 to define the area of the electrical resistive liquid or the electrical resistive gel into a uniform shape, thereby properly providing a turn-on resistance by the electrical resistive liquid or the electrical resistive gel between the micro LEDs 75 for establishing current paths through the micro LEDs 75 and for turning on the same.

The probe electrodes 10 may be in line contact with one side and the other side of the surface-contact probe 20 to supply power for the surface-contact probe 20.

The imaging unit 30 may provide a photographed image to the control unit 40 by photographing the LED assembly 70 from the opposite surface to which the surface-contact probe 20 is in contact.

The control unit 40 supplies turn-on power to the probe electrodes 10 in the forward direction and uses images of the LED assembly 70 photographed by the imaging unit 30 before and after supplying the turn-on power for visual comparison as a basis for inspecting the illumination state of the micro LEDs 75.

The output unit 50 may output a test result of inspecting the illumination state of the micro LEDs 75.

As described above, with the apparatus for illumination inspection of micro LEDs according to at least one embodiment of the present disclosure, the surface-contact probe is used for making surface contact with the front surface of the LED assembly of a plurality of micro LEDs arranged in the forward direction, the electric power is applied to the micro LEDs at both ends of the surface-contact probe for turning on the micro LEDs, and thereby inspects the state of illumination of the micro LEDs in a lump. Accordingly, the present disclosure can reduce the time and cost required to perform the illumination inspection while reducing the physical damage to the devices during the inspection process with no pin involved to directly contact the micro LEDs.

The implementations described herein may be implemented in, for example, a method or process, an apparatus, or a software program. Even if only discussed in the context of a single form of implementation (for example, discussed only as a method), the implementation of features discussed may also be implemented in other forms (for example, an apparatus or program). An apparatus may be implemented in, for example, appropriate hardware, software, and firmware. The methods may be implemented in, for example, an apparatus such as, for example, a processor, which refers to processing devices in general, including, for example, a computer, a microprocessor, an integrated circuit, or a programmable logic device. Processing devices also include communication devices, such as, for example, computers, cell phones, portable/personal digital assistants ("PDAs"), and other devices that facilitate the communication of information between end-users.

Although the present disclosure has been described about the embodiments shown in the drawings, which is only exemplary, various modifications and equivalent other embodiments are made possible therefrom by those skilled in the art to which the art pertains.

Accordingly, the true technical scope of the present disclosure should be defined by the following claims.

What is claimed is:

1. An apparatus for inspecting illumination of micro light emitting diodes (LEDs), comprising:
 a surface-contact probe configured to make a surface contact, through an electrical resistive material, with a front surface of an LED assembly of a plurality of micro LEDs arranged in a forward direction and to interconnect LED electrodes at both ends of the micro LEDs;
 probe electrodes configured to be in line contact with one side and another side of the surface-contact probe and to supply an electric power;
 an imaging unit configured to photograph the LED assembly from an opposite surface of the surface-contact probe, which is opposite to where the surface-contact probe is contacted; and
 a control unit configured to supply the electric power to the probe electrodes in a forward direction along the plurality of micro LEDs as aligned and to use images of the LED assembly photographed by the imaging unit before and after supplying the electric power as a basis for inspecting the illumination of the micro LEDs.

2. The apparatus of claim 1, wherein the surface-contact probe comprises any one among electrical resistive film, electrical resistive PDMS (polydimethylsiloxane), electrical resistive liquid, and electrical resistive gel.

3. The apparatus of claim 2, the surface-contact probe further comprises a pressing member configured to press the surface-contact probe when the surface-contact probe is the electrical resistive film.

4. The apparatus of claim 3, the pressing means comprises a cushion member for pressing the electrical resistive film with an elastic force.

5. The apparatus of claim 3, the pressing means comprises a pressing chamber forming an empty space therein to press and seal the probe electrode so that the non-resistant film, which is a surface-contact probe, is disposed in the empty space, and injecting a pressing fluid into the inner empty space through an inlet.

6. The apparatus of claim 5, the pressing fluid comprises a non-conductive gas or liquid.

7. The apparatus of claim 2, the surface-contact probe further comprises a guide wall configured to define an area of the electrical resistive liquid or the electrical resistive gel in conformance with the LED assembly wherein the surface-contact probe, when the surface-contact probe is the electrical resistive liquid or the electrical resistive gel.

8. The apparatus of claim 1, further comprising a transparent substrate configured to fix the LED assembly.

9. The apparatus of claim 1, further comprising an output unit configured to output results of inspecting the illumination of the micro LEDs.

\* \* \* \* \*